(12) United States Patent
Thiagarajan et al.

(10) Patent No.: US 9,909,816 B2
(45) Date of Patent: Mar. 6, 2018

(54) THERMAL MANAGEMENT SYSTEM

(71) Applicant: General Electric Company, Schenectady, NY (US)

(72) Inventors: Naveenan Thiagarajan, Niskayuna, NY (US); Hendrik Pieter Jacobus de Bock, Clifton Park, NY (US); William Dwight Gerstler, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/271,280

(22) Filed: Sep. 21, 2016

(65) Prior Publication Data

US 2017/0010050 A1    Jan. 12, 2017

Related U.S. Application Data

(63) Continuation of application No. 14/570,204, filed on Dec. 15, 2014, now Pat. No. 9,476,651.

(51) Int. Cl.
| | |
|---|---|
| *H01M 10/052* | (2010.01) |
| *F28D 15/02* | (2006.01) |
| *H01M 10/659* | (2014.01) |
| *F28D 15/04* | (2006.01) |
| *F28D 20/02* | (2006.01) |
| *H01L 23/34* | (2006.01) |
| *H01L 23/427* | (2006.01) |
| *F28D 20/00* | (2006.01) |

(52) U.S. Cl.
CPC ......... *F28D 15/0275* (2013.01); *F28D 15/02* (2013.01); *F28D 15/04* (2013.01); *F28D 20/02* (2013.01); *H01L 23/34* (2013.01); *H01L 23/4275* (2013.01); *H01M 10/052* (2013.01); *H01M 10/659* (2015.04); *F28D 2020/0008* (2013.01); *Y02E 60/145* (2013.01)

(58) Field of Classification Search
CPC .......................... H01M 10/659; H01M 10/052
See application file for complete search history.

(56) References Cited

U.S. PATENT DOCUMENTS

| | | |
|---|---|---|
| 5,579,830 A | 12/1996 | Giammaruti |
| 6,624,349 B1 | 9/2003 | Bass |
| 6,631,755 B1 | 10/2003 | Kung et al. |
| 2002/0098408 A1 | 7/2002 | Lafollette |
| 2011/0081564 A1 | 4/2011 | Choi et al. |

(Continued)

FOREIGN PATENT DOCUMENTS

WO    2013097031 A2    7/2013

OTHER PUBLICATIONS

Mochizuki et al.,"A Review of Heat Pipe Application Including New Opportunities", Frontiers in Heat Pipes, Global Digital Central, (2011), 2, 013001, 15 Pages.

(Continued)

*Primary Examiner* — Olatunji Godo
(74) *Attorney, Agent, or Firm* — Nitin N. Joshi

(57) ABSTRACT

A system is disclosed. The system includes a thermally conductive enclosure bounding an interior cavity, a metallic cell wall structure disposed within the cavity, in thermal communication with the enclosure, and defining a plurality of cells, and a phase change material disposed within the cells and in thermal communication with the cell walls. The plurality of cells have a cell width less than about 5 millimeters, and the cell wall thickness of the cell wall structure is in a range from about 0.25 millimeter to about 1 millimeter.

19 Claims, 3 Drawing Sheets

(56) References Cited

U.S. PATENT DOCUMENTS

| | | | |
|---|---|---|---|
| 2011/0097623 A1* | 4/2011 | Marinis, Jr. | ......... H01M 2/0285 |
| | | | 429/163 |
| 2012/0192574 A1 | 8/2012 | Ghoshal et al. | |
| 2012/0206880 A1 | 8/2012 | Andres et al. | |
| 2012/0227926 A1 | 9/2012 | Field et al. | |
| 2014/0090808 A1 | 4/2014 | Bessho et al. | |
| 2014/0284020 A1 | 9/2014 | Amir et al. | |
| 2016/0305279 A1 | 10/2016 | Gerstler et al. | |
| 2017/0064868 A1 | 3/2017 | Rush et al. | |
| 2017/0067693 A1 | 3/2017 | Rush et al. | |

OTHER PUBLICATIONS

Christopher Robak., "Latent Heat Thermal Energy Storage with Embedded Heat Pipes for Concentrating Solar Power Applications", Master's Theses, University of Connecticut, 2012, Paper 229, obtained from http://digitalcommons.uconn.edu/gs_theses/229, 68 Pages.

Yogev et al.,"PCM Storage System with Integrated Active Heat Pipe", Energy Procedia, Proceedings of the SolarPACES 2013 International Conference, ScienceDirect, 2014, vol. 49, pp. 1061-1070.

Gerstler et al., "Systems And Methods For Using Additive Manufacturing For Thermal Management", GE Copending Application No. 611976649, filed on Apr. 8, 2014.

De Bock et at, "Circuit Card Cartridge For An Electronic System", GE Co-pending U.S. Appl. No. 14/592,387, GE filed on Aug. 4, 2016.

* cited by examiner

THERMAL MANAGEMENT SYSTEM

CROSS REFERENCE TO RELATED APPLICATIONS

This application is a continuation of co-pending U.S. patent application, Ser. No., 14/570,204, entitled "THERMAL MANAGEMENT SYSTEM" filed on 15 Dec. 2014, which is hereby incorporated by reference in its entirety.

BACKGROUND

The invention relates generally to a thermal management system. More particularly, the invention relates to a system having an enhanced thermal management design and structure.

With the development of more sophisticated electronic components, systems are subject to increasingly demanding power density levels. The heat generated during operation of these components can degrade the performance and reliability of the overall system and can even cause system failure.

With the increased need for heat dissipation from microelectronic devices caused by these conditions, thermal management becomes an increasingly important element of the design of electronic products. As noted, both performance reliability and life expectancy of electronic equipment are inversely related to the component temperature of the equipment.

Contemporary aircraft use avionics to control the various equipment and operations for flying the aircraft. The avionics may be stored in an avionics chassis that performs several beneficial functions, such as electrically shielding the avionics from electromagnetic interference (EMI), protecting the avionics from lightning strikes, dissipating the heat generated by the avionics, and protecting the avionics from environmental exposure.

Thermal management of electronics is a key element in the avionics systems, especially in the event of loss of air cooling. A reduction in overall thermal resistance of the system including the card and the chassis may be obtained by enhancing heat extraction, spreading, and convection techniques to dissipate the heat from the chip to the ambient using heat pipes, fin optimization for natural convection and forced convection techniques. In aviation electronics, higher thermal mass was used to store the heat by using larger heat sinks. Phase change materials (PCM) such as waxes are used to store dissipated thermal energy. Further, thermal conductivity of the phase change materials were increased by the use of higher thermal conductivity additives, use of simple metal fins submerged in the PCM and use of metal foams.

While the aforementioned heat dissipation enhancement strategies are useful to the steady state cooling of avionics, a need exists to offset peak thermal loads and dampen transients to increase the reliability and life of avionics. A further need exists to store heat from the system in the event of loss of supplied cooling air from the aircraft, thereby providing additional time for the avionics to perform its operation without compromising functionality. Therefore, a reduction in thermal resistance of the PCM is desirable.

BRIEF DESCRIPTION

One aspect of the invention includes a system. The system includes a thermally conductive enclosure bounding an interior cavity, a metallic cell wall structure disposed within the cavity defining a plurality of cells and in thermal communication with the enclosure, and a phase change material disposed within the cells and in thermal communication with the cell walls. The plurality of cells have a cell width less than about 5 millimeters, and the cell wall thickness of the cell wall structure is in a range from about 0.25 millimeter to about 1 millimeter.

One aspect of the invention includes a system. The system includes a thermally conductive enclosure bounding an interior cavity, a metallic cell wall structure disposed within the cavity defining a plurality of cells, a phase change material disposed within the cells and in thermal communication with the cell walls and a thermal conductor disposed in thermal communication with the enclosure and the cell wall structure. The plurality of cells have a cell width less than about 5 millimeters, and the cell wall thickness of the cell wall structure is in a range from about 0.25 millimeter to about 1 millimeter.

One aspect of the invention includes a system. The system includes an enhanced thermally conductive enclosure having a vapor chamber structure and bounding an interior cavity, a metallic cell wall structure integral to the enclosure disposed within the cavity defining a plurality of cells, and a phase change material disposed within the cells and in thermal communication with the cell walls. The plurality of cells have a cell width less than about 5 millimeters, and the cell wall thickness of the cell wall structure is in a range from about 0.25 millimeters to about 1 millimeter.

DETAILED DESCRIPTION

Embodiments of the invention described herein address the noted shortcomings of the state of the art. One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a" "an" and "the" are intended to mean that there are one or more of the elements. The terms "comprising" "including", "involving", and "having" are intended to be inclusive and mean that there may be additional elements other than the listed elements. All ranges disclosed herein are inclusive of the endpoints, and the endpoints are combinable with each other.

Approximating language, as used herein throughout the specification and claims, may be applied to modify any quantitative representation that could permissibly vary without resulting in a change in the basic function to which it may be related. Accordingly, a value modified by a term such as "about" is not limited to the precise value specified. In some instances, the approximating language may correspond to the precision of an instrument for measuring the value.

In general, embodiments of this invention are directed to a system having an enhanced thermal management capability, designed to offset the additional heat loads in the event of loss of cooling.

Figure 1:
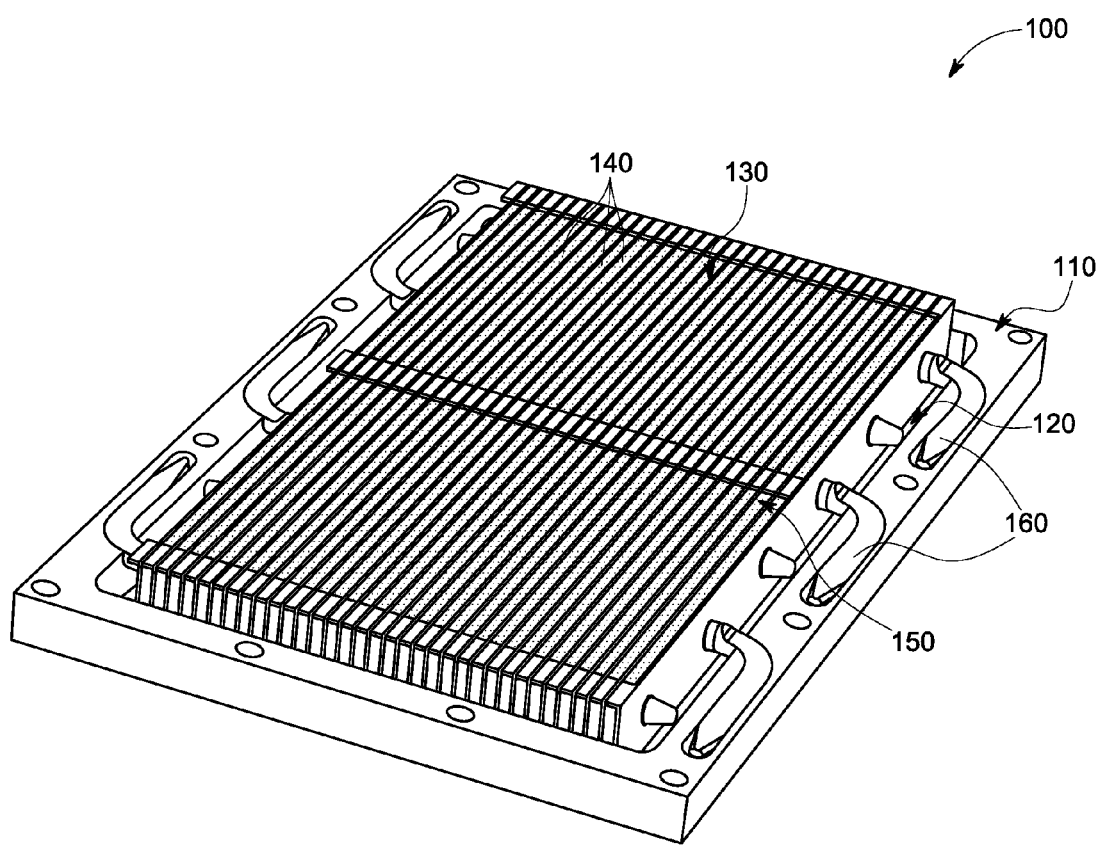
FIG. 1 is a cross-sectional view of a system that is designed to store dissipated thermal energy from a thermal source, according to some embodiments of the present invention.

FIG. 1 is a cross-sectional view of a system 100. The system 100 includes a structure that is designed to temporarily store dissipated thermal energy from any thermal source (not shown), such as, for example, electronic equipment. In some aspects, system 100 includes a thermally conductive enclosure 110 bounding an interior cavity 120. A metallic cell wall structure 130 is disposed within the cavity 120 in thermal communication with the enclosure 110, defining a plurality of cells 140. A phase change material 150 is disposed within the plurality of cells 140.

The phase change material 150 also may be disposed outside of the cell wall structure 130 within the cavity 120, in addition to that disposed within the plurality of cells 140. In one embodiment, the phase change material 150 is disposed in all the porosity available in the cavity 120. In operation, heat is exchanged between the electronic equipment and the phase change material 150 of the system 100. For example, if electronic equipment, as a heat source, is at a higher temperature than the phase change material 150, then heat will be transferred from the electronic equipment to the phase change material 150, thereby storing energy. By contrast, if the electronic equipment is at a lower temperature than the phase change material 150 then heat will be transferred from the phase change material 150 to the electronic equipment, thereby releasing energy from system 100.

In some embodiments, the system 100 disclosed herein provides a faster cooling rate for an electronic equipment from hereto known heat storage apparatuses by means of improved design of the system 100 components and the materials chosen for the same.

The enclosure 110 is a closed housing that contains the cell wall structure 130 and the phase change material 150. In various embodiments, the enclosure 110 acts as an interface for the heat exchange between the electronic equipment or other heat source and the phase change material 150. The enclosure 110 may heat up by receiving heat from the electronic equipment during thermal energy transfer from the electronic equipment to the phase change material 150 and during thermal energy transfer from the phase change material 150 to the electronic equipment. Therefore, a thermally conductive enclosure 110 is desired. As used herein, a "thermally conductive enclosure" is "an enclosure that includes a thermally conductive element disposed to provide thermal communication between the exterior (i.e., the environment outside the enclosure) and interior of the enclosure. Examples of such a thermally conductive enclosure include an enclosure made entirely or partially of metallic or other thermally conductive material, or a thermal conductor such as a heat pipe, vapor chamber, or conductive rod embedded within the enclosure." Further, as used herein a "thermally conductive element" has an effective thermal conductivity of at least about 10 W/m-K. In one embodiment, the enclosure 110 is formed by copper or an alloy of copper. In one embodiment, the enclosure 110 includes aluminum, magnesium, titanium, or any combinations thereof. In one embodiment, the enclosure 110 is made from an alloy of copper and molybdenum.

As alluded to above, in various embodiments of the present invention, heat is exchanged from an external heat source or heat sink through the enclosure 110. In one specific embodiment, heat is exchanged between the enclosure 110 and the phase change material 150. In one embodiment, a thermal conductor 160 is disposed in thermal communication with the enclosure 110 and the cell wall structure 130 for the exchange of heat as shown in FIG. 1. The thermal conductor 160 may include a heat pipe, vapor chamber, copper rod, aluminum rod, diamond rod, graphite conductor, or any combinations thereof. While any of these conductors is suitable, use of a heat pipe or vapor chamber typically offers enhanced conduction over monolithic conductors.

In one embodiment, the thermal conductor 160 is a heat pipe with one end of the heat pipe embedded in the enclosure 110 for improved heat conduction. This is in stark contrast to the heat pipes that were largely used for transferring heat from a fluid such as, for example, a liquid or air, to the phase change materials, as suggested in some of the previous systems. The heat pipe 160 in some of the embodiments of present invention may be fabricated from aluminum, copper, or any other high thermal conductivity material. In one embodiment, improved heat conduction between the enclosure 110 and the heat pipe 160 is promoted by metallic joining of the enclosure 110 and the heat pipe 160. For instance, soldering, brazing, or a combination of these, with or without any other intervening ("filler") materials, may be used for enhancing the metallic contact and thereby increasing the thermal conductivity between the heat pipe 160 and the enclosure 110.

Therefore, in one embodiment, the enclosure 110, thermal conductor 160, cell wall structure 130, and the phase change material 150 within the cells are respectively disposed in thermal communication. In one embodiment, the thermal conductor 160 is the primary means of heat conduction between the cell wall structure 130 and the enclosure 110, and the cell wall structure 130 is the primary means of heat conduction between the phase change material 150 and the thermal conductor 160. Hence the phase change material 150 located inside the plurality of cells 140 exchanges heat with the heat pipe 160 through the metallic cell wall structure 130, in contrast to prior art systems where heat pipes are used to transfer heat directly to the phase change material from the heat source.

In various embodiments, the heat pipe 160 may include a working fluid (not shown) having a liquid to vapor transformation temperature in the operating temperature range of the system 100. Working fluid may be selected from a variety of well-known two phase fluids depending upon the application, and the operating temperature range to be covered by the system 100. Such fluids may include, for example, water, ammonia, or organic liquids such as acetone, methanol, or ethanol.

Further, in some embodiments, heat pipe 160 includes a wick like structure embedded in the inner walls of the heat pipe 160. In operation, heat is exchanged between the enclosure 110 and the metallic cell wall structure 130 by the evaporation and condensation of the working fluid. For example, if the enclosure 110 is at a higher temperature than the phase change material 150, then heat is transferred from the enclosure to the cell wall structure 130 and phase change material 150, thereby storing energy in the phase change material 150. By contrast, if the enclosure 110 is at a lower temperature than the phase change material 150, then the heat is transferred from the phase change material 150 and cell wall structure 130 to the enclosure 110, thereby releasing energy from phase change material 150.

Figure 2:
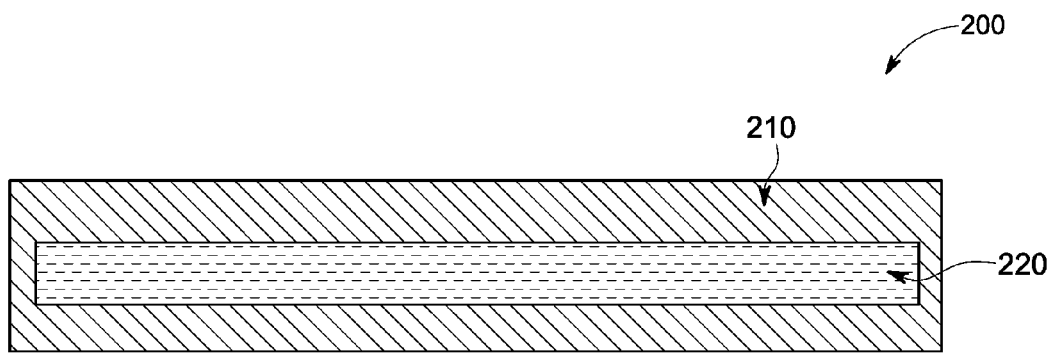
FIG. 2 is a cross-sectional view of an enclosure having a vapor chamber structure for an enhanced thermal conductivity, according to one embodiment of the present invention.

The thermally conductive enclosure 110 may be a monolithic conductor, such as a solid metal frame, or may have a heat-pipe-like structure in a part or whole of the enclosure. The enclosure 110 may include top and bottom parts (not shown) that are constructed from a thermally conductive material such as copper or aluminum and may provide a thermal path for heat to transfer from the electronic equipment. In one embodiment, the enclosure 110 is a 3-dimensional heat pipe designed as a vapor chamber having hollow and hermetically sealed structure as shown in the cross-sectional view exhibited in FIG. 2. The vapor chamber 200 may have an enclosed wick structure 210 and be filled with a liquid 220. Liquid (alternately "condensable vapor") 220 evaporates in to vapor upon exposure to heat, moves to the colder end, and condenses, thus aiding rapid spreading of heat in the enclosure 110. In one embodiment, a lid (not shown) of the enclosure 110 that is in direct thermal communication with the electronic equipment has the disclosed vapor chamber 200 structure. In one embodiment, the enclosure includes the vapor chamber structure in all the sides.

Phase change materials 150 as used herein are the materials that have reversible phase change in the operating temperature range and are able to store latent heat at a particular temperature range. The phase change material 150 may absorb heat and change phase. The phase change material may include liquid-solid phase change, solid-solid phase change, liquid-vapor phase change, or a combination of any of these.

Solid-solid phase change materials undergo reversible solid-state crystal structure transitions at temperatures ranging from ambient up to about 100° C. The latent heat of liquefaction or latent heat of vaporization of the two-phase material may allow the material to absorb the heat at a constant temperature in an isothermal or nearly isothermal process. The two-phase material can thus provide a heat sink that absorbs heat without significantly increasing the temperature of the system 100. In an example, paraffin is used as a two-phase material inside the cavity. Paraffin may change from a solid state to a liquid state between 20-100 degrees centigrade.

The phase change material 150 may comprise a variety of materials depending on the application and the operating temperature range. Suitable materials include, without limitation, organic waxes, inorganic multi-phase metal alloys, eutectic salts, and other materials known in the art. Selection and quantity of phase change material 150 will depend upon the desired melting point and how much heat will need to be absorbed. Transition temperatures can be selected by forming solid solutions of different organic/inorganic compounds. Transition of these solid-solid phase change materials can occur over a fairly limited temperature range. Phase change material 150 may also be a blend of different compounds to obtain the desired phase transition temperature or range. Further, different types of phase change materials may be used in a single system 100 to increase the temperature range over which the system 100 will be effective.

In one embodiment, a two-component phase change material is used as a phase change material. As used herein, a two-component phase change material is a material that changes into two different components during a phase change by absorbing heat. Hydrated salts are illustrative two-component phase change materials.

In general, hydrated salts tend to segregate into anhydrous salt and water when absorbing heat. Due to gravity, the molten salt tends to separate from the water and settle at the bottom. This may prevent the release of heat when the process is reversed. That is, when the heat is to be recovered from the melted and segregated salts by re-solidifying the hydrated salts, proper combination of salt and water is hindered due to the segregation and settling. Segregation and settling are major drawbacks of using hydrated salts as phase change materials. Abating these disadvantages increases the potential of using hydrated salts or any other two-component systems as phase change materials for thermal storage.

The interior cavity 120 (FIG. 1) bounded by the enclosure 110 is the volume of the housing bounded by the enclosure 110. The metallic cell wall structure 130 formed by a high thermal conductivity metallic or alloy monolithic material is disposed within the cavity 120. In one embodiment, the cell wall structure occupies a considerable volume inside the cavity 120. In one embodiment, the metallic cell wall structure is formed by thin metallic sheets or fins. Thin metallic sheets provide high surface area for thermal conduction, thereby facilitating an efficient heat transfer.

Generally, very thin metallic foils increase the porosity of the total enclosure and provide greater volume for the phase change materials to occupy, thereby increasing the overall heat storage capacity in a given volume. Therefore, it is reasonable to design very thin metallic foils for increased accommodation of phase change materials. Metallic foils as thin as less than 0.002 millimeters have been suggested in previous systems, with available porosity for the phase change materials greater than even 90%.

In contrast, in some embodiments of the present invention, thick metallic fins (sheet materials) are used as the cell wall structure, providing an advantage of faster heat transfer as compared to very thin foils. Thick metallic fins greatly enhance the thermal conduction and thereby penetration of heat into the energy storage device. In one embodiment, the thickness of the cell walls is in the range from about 0.25 millimeters to about 2 millimeters. In a further embodiment, the cell wall thickness is in the range from about 0.25 millimeters to about 1 millimeter.

In one embodiment of the present invention, a cell wall structure 130 having a two phase heat transporter such as, for example, a heat pipe or a vapor chamber is used to enhance the thermal conductivity. This enhanced conductivity would aid in faster heat transfer between the enclosure 110 and the phase change material 150 as compared to the metallic fins or foils. The heat pipe structure or the vapor chamber structure used herein may include a two phase material and wick structure similar to or different from the previously disclosed vapor chamber structure 200 (FIG. 2) of the enclosure 110 or the heat pipe structure of the thermal conductor 160.

Figure 3:
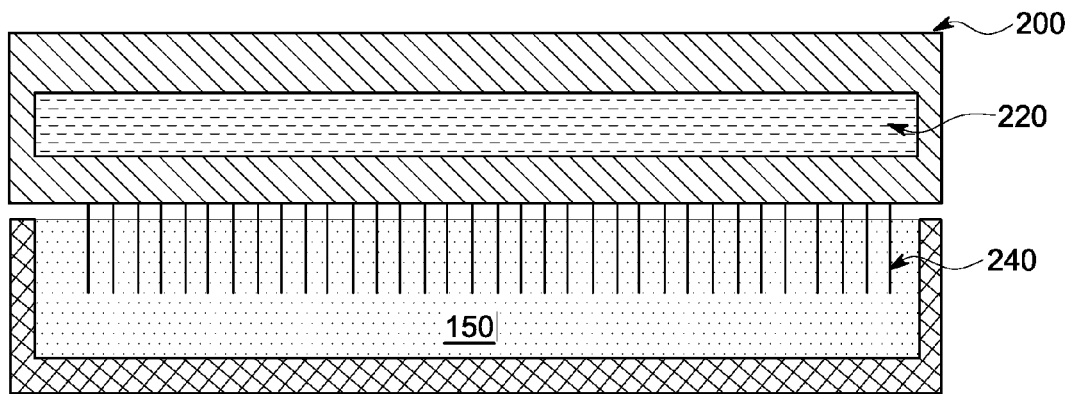
FIG. 3 provides a cross sectional view of an illustrative cell wall structure having metallic fins as an integral part of the enclosure, according to one embodiment of the present invention.
Figure 4:
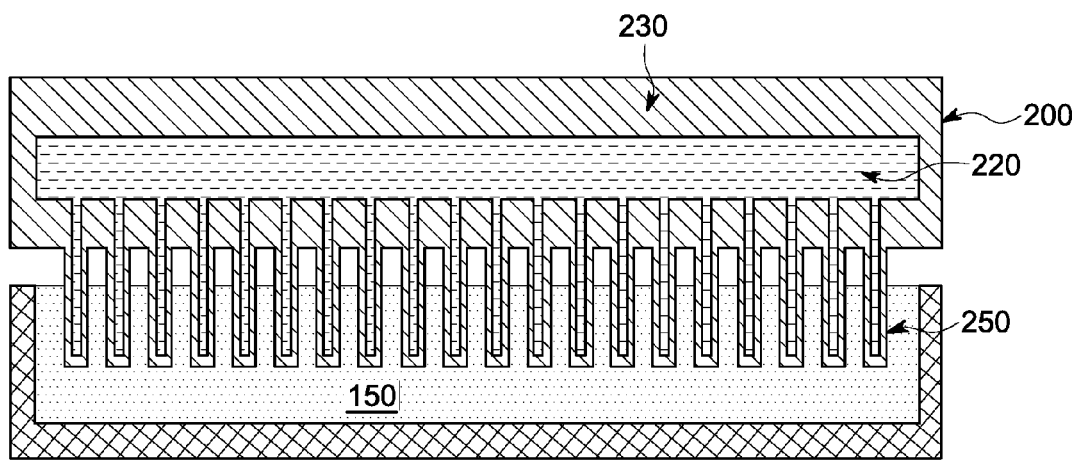
FIG. 4 is an illustrative cross-sectional view of a system that has an enclosure having a vapor chamber structure and an integral cell wall structure of a two phase heat transporter construction, according to one embodiment of the present invention.

In one embodiment, thermal conductivity between the enclosure 110 and the cell wall structure 130 is enhanced by building the cell wall structure 130 integral with the enclosure 110, thereby providing a direct thermal path between the enclosure 110 and the cell wall structure 130, without any other interfacing thermal conductors. FIG. 3 provides cross sectional view of an illustrative cell wall structure having metallic fins 240 integral with the enclosure 110 that has a vapor chamber structure 200. FIG. 4 is a cross sectional view of an illustrative cell wall structure having a two phase heat transporter 250 integral with the enclosure 110 having a vapor chamber structure 200. As illustrated in FIG. 4, heat may be received from electronic equipment at the top part 230 of the enclosure 200 and conducted throughout the integrated cell wall structure 130 through a common condensable vapor 220 thus transferring heat directly to the phase change material 150 using an interface of the walls of the cell wall structure 130 having the construction of two phase heat transporter 250. It should be appreciated that FIG. 3 and FIG. 4 are purely for illustrative purposes, and a number of fin or two phase heat transporters arrangements may be employed including, for example, different two dimensional or three dimensional constructions of extending the fins or two phase heat transporters. Further, it should be appreciated that the metallic fins 240 may contact the top part 230 of enclosure 200 at the outermost cover (not shown), in the wick structure (not shown), or with the condensable vapor 220 depending on the material and structure of the enclosure and specific application requirements.

In one embodiment, the cell walls having a two phase heat transporter structure have a thickness up to about 4 millimeters. In one embodiment, the thickness is in the range from about 0.25 millimeters to about 2 millimeters. In another embodiment, the thickness of the cell walls having a two phase heat transporter structure is in the range from about 1 millimeter to about 4 millimeters. As used herein the thickness "t" of the cell wall structure 130 having the two phase heat transporter construction 250 is the shortest distance between outer surfaces of the two outermost walls as shown in FIG. 4.

The overall volume of the cell wall structure 130 defines porosity of the cavity 120 inside the enclosure 110. This porosity is approximately the volume available for the phase change material 150 to be filled to store heat energy. As disclosed earlier, previous designs in the art have suggested maximizing this porosity to store more phase change material. As high porosity as greater than 90% were used earlier in the effort to accommodate higher volume of phase change material. In stark contrast, embodiments of the present invention are directed to decreasing thermal resistance by the increment in fin area of cross-section, accommodating the decrease in porosity, and achieving increase in overall efficiency of the thermal storage.

In some embodiments of the present invention, the overall cell porosity within the interior cavity is designed to be in a range from about 50% to about 88%. In a particular embodiment, the cell porosity within the interior cavity is in a range from about 70% to about 85%.

The metallic cell wall structure 130 may further serve additional functions in the system 100 depending on the phase change material and the operating temperature range. In one embodiment, the metallic cell wall structure includes a coating that is anti-corrosive, hydrophilic, or having a combination of anti-corrosive and hydrophilic property. Further, the system 100 may include multiple cell wall structures 130 varying in the material, thickness, shape or functional enhancements. For example, the cell walls that directly receive heat from the thermal conductor 160 and distribute to the other parts of the cell wall structure 130 may have a thicker configuration compared to the cell walls that are in the interior and primarily exchange heat with the phase change material 150.

The metallic cell wall structure 130 defines plurality of cells 140 in the cavity 120. The plurality of cells 140 may comprise hundreds of tiny cells housing the phase change material 150. In one embodiment, the metallic cell wall structure 130 circumscribes about 5-50 cells per cubic centimeter. The tiny cells are designed to maintain a small distance that heat must travel in the phase change material 150, thus minimizing the effect of the phase change material's typically low thermal conductivity on the overall thermal conduction within the system 100.

Depending on the materials of the cell wall structure and the phase change material 150, the width of the cells in the plurality of cells 140 may vary from one system to another system. As used herein, the "width" of a cell is the width of that cell from the inside edge of one wall to the inside edge of the opposite wall. For example, if the plurality of cells 140 are designed to be of rectangular shape, then the width of the cells is the width of the inside cavity (alternately, "cell cavity") of the rectangular cell. In one embodiment, the cells of plurality 140 may have a cell width less than about 5 millimeters. In one embodiment, the width of the cells is less than about 2 millimeters. In many embodiments, the width of the cells is greater than 0.5 millimeters.

Considering that the thermal conduction can happen from both the opposite walls to heat the phase change material 150 inside the cell, the thermal path inside the phase change material occupying the cell cavity is approximately equivalent to half the width of the cell ("half-cell thickness" or "half-cell width"). The half-cell width may be designed considering the thermal conductivity of the cell wall structure 130, thermal conductivity of the phase change material 150, and the desired speed of heat transfer to the entire phase change material 150. Therefore, in one embodiment, the half-cell width is designed to reduce conduction path through phase change material 150 to a very thin layer and to eliminate the need for convection or for enhancement of the thermal conductivity of the phase change material 150. Therefore, design of the present heat storage system 100 in some embodiments of the present invention is compatible with multiple phase change materials 150 without the need for alteration of the phase change material 150. The system 100 can be designed to suit the phase change material 150 unlike previously described systems employing conduction through a randomly sized conductor, such as foam. In one embodiment, the half-cell width of the plurality of cells is in the range from about 0.25 millimeters to about 1 millimeter, thereby making the cell width to be in the range of about 0.5 millimeters to about 2 millimeters. In one embodiment, a conduction length through the phase change material 150 is designed to be less than about 0.8 millimeters.

A reduced conduction length through low thermally conductive phase change material would reduce time required to heat the phase change material. A rapid heating of the phase change material would result in low thermal gradient between the heat source and the phase change material 150, thereby enhancing the heat transfer from the heat source to the phase change material 150. In one embodiment of the present invention, an effective temperature difference between an exterior of the enclosure 110 and the phase change material 150 is decreased drastically as compared to previously described systems.

Thickness and length of the cell wall structure 130, width of the plurality of cells 140, and the number of cells in the plurality of cells 140 define the surface area of the total cell wall structure 130. This is a significant measure as the increased surface area of the cell wall structure promotes increased thermal dissipation to the phase change material 150. Some embodiments of the present invention seek to increase the surface area of the cell wall structure 130, without unduly sacrificing the volume available for the phase change material 150. Corrugating the cell walls of the cell wall structure 140 is one such technique. In one embodiment, a ratio of the surface area of the cell wall structure 130 to volume of the cavity is in a range from about 50 $m^2/m^3$-1500 $m^2/m^3$.

In various embodiments of the present invention, a majority of volume of the phase change material is disposed in the plurality of cells 140 formed by the metallic cell wall structure 130. This structure, with its emphasis on very small cell size, enables use of a two-component phase change material such as, for example, a hydrated salt, with decreased impact of phase segregation of the hydrated salts after melting. This helps in faster and more complete re-solidification of the two-component materials. Hence the cell wall structure 130 and the plurality of cells 140 improve process stability and repeatability of the phase change material.

EXAMPLE

The following example illustrates the method, materials and results, in accordance with specific embodiments, and as such should not be construed as imposing limitations upon the claims. All components are commercially available from common suppliers.

An exemplary thermal management system 100 as referred in FIG. 1 was built with an aluminum enclosure 110 of a rectangular structure with top and bottom lids and defining a cavity 120. An aluminum cell wall structure 130 is placed within the cavity 120. The cell wall structure 130 included fins of approximately 0.5 millimeters thickness with a spacing between the cell walls (that is, the "cell cavity width") of about 1.6 millimeters. A copper heat pipe 160 was placed in contact with the enclosure 110 and the cell wall structure 130, thus building a "finned heat pipe structure". This structure has about 75% porosity in the cavity 120. A commercial paraffin wax with a melting point of about 69° C. was filled in the available porosity. A heat-input of about 30 W was applied to long sides of the enclosure 110 and temperatures were measured at the sides of the enclosure 110, called the heater temperature "$T_{heater}$", and at the center of the enclosure 110, in the paraffin, called the center temperature "$T_{center}$". A baseline experiment was conducted earlier with an enclosure having similar dimensions as described above, enclosing same paraffin, and with the same heat input, but without the finned heat pipe structure.

Figure 5:
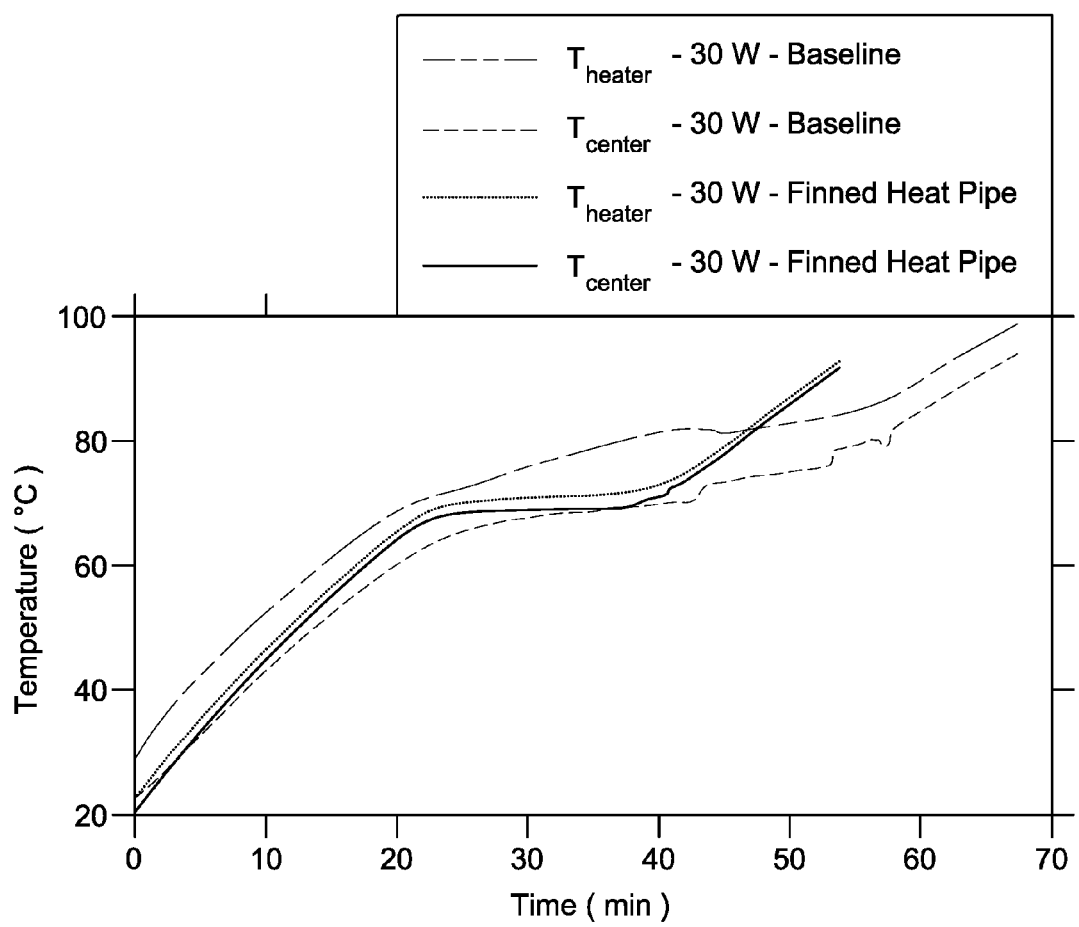
FIG. 5 is graphical comparison of the results of a baseline experiment and a finned heat pipe structure, in accordance one embodiment of the present application.

Experiments were conducted by turning the heater on to heat the enclosure 110 from the long sides and results were plotted as shown in FIG. 5. In the baseline experiment, that is, in the absence of the finned heat pipe structure, Theater continued to rise even after the wax started melting at 69° C. as shown by curve 310 of FIG. 5. Further, difference in temperature between the Theater 310 and the $T_{center}$ (curve 320) of the baseline was in excess of 10° C. at the completion of melting. This was mainly due to the high thermal resistance of the paraffin wax arising from the poor thermal conductivity. In the case where the finned heat pipe structure was employed, once the melting point of wax was reached, the Theater 330 was almost constant. The difference between the $T_{heater}$ 330 and the $T_{center}$ 340 of the finned heat pipe structure was less than about 2° C. This result is attributed to the significant lower thermal resistance, relative to baseline, due to the thermal architecture of the finned heat pipe structure, which minimizes the conduction distance through the paraffin wax.

For an application requiring heat storage in an enclosure, the demonstrated enhanced thermal conductivity would mean that heat could be stored in the phase change materials efficiently with the metallic cell wall structure in thermal contact with heat pipes or other enhanced thermal conductors. The developed thermal architecture leads to isothermal congruent melting of the phase change material. Using such a system, a heat generating electronic component will not experience an appreciable increase in temperature until all the phase change material has changed phase, even under the loss of all air cooling. This directly results in high reliability of the electronic components.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system comprising:
   a thermally conductive enclosure bounding an interior cavity, wherein at least a portion of the thermally conductive enclosure comprises a hollow and hermetically sealed structure enclosing a liquid and a wick structure; and
   a metallic cell wall structure disposed within the interior cavity and in thermal communication with the thermally conductive enclosure, wherein the metallic cell wall structure comprises:
      a plurality of cells, wherein each cell comprises cell walls defining a cell volume, a cell width less than about 5 millimeters, and a cell wall thickness in a range from about 0.25 millimeter to about 1 millimeter; and
      a phase change material disposed within the cells and in thermal communication with the cell walls.

2. The system of claim 1, wherein the cell width is greater than about 0.5 millimeter.

3. The system of claim 1, wherein the cell width is less than about 2 millimeters.

4. The system of claim 1, wherein the interior cavity has a total cell porosity in a range from about 50% to about 88%.

5. The system of claim 4, wherein the total cell porosity within the interior cavity is in a range from about 70% to about 85%.

6. The system of claim 1, wherein a ratio of a surface area of the cell walls to the cell volume is in a range from about 50 $m^2/m^3$ to about 1500 $m^2/m^3$.

7. The system of claim 1, further comprising a thermal conductor disposed between the thermally conductive enclosure and the metallic cell wall structure.

8. The system of claim 7, wherein the thermal conductor comprises a heat pipe, a vapor chamber, a copper rod, an aluminum rod, a diamond rod, a graphite conductor, or any combinations thereof.

9. The system of claim 8, wherein the thermally conductive enclosure, the thermal conductor, the metallic cell wall structure, and the phase change material within the plurality of cells are respectively disposed in thermal communication.

10. The system of claim 1, wherein the cell walls have a corrugated structure.

11. The system of claim 1, wherein the metallic cell wall structure is integral with the thermally conductive enclosure.

12. The system of claim 11, wherein the metallic cell wall structure is a monolithic conductor.

13. The system of claim 10, wherein the metallic cell wall structure comprises a heat pipe, a vapor chamber, or a combination of the heat pipe and the vapor chamber.

14. The system of claim 1, wherein the cell walls comprise an anti-corrosive, a hydrophilic, or a combination of the anti-corrosive and the hydrophilic coating.

15. The system of claim 1, wherein the metallic cell structure comprises a plurality of cell wall structures disposed in the interior cavity.

16. The system of claim 1, wherein the phase change material comprises an inorganic material having solid to liquid transformation at an operating temperature of the interior cavity.

17. The system of claim 1, wherein the thermally conductive enclosure comprises a vapor chamber structure, an embedded heat pipe, or a combination of the vapor chamber structure and the embedded heat pipe.

18. A system comprising:
a thermally conductive enclosure bounding an interior cavity, wherein at least a portion of the thermally conductive enclosure comprises a hollow and hermetically sealed heat pipe structure enclosing a liquid and a wick structure; and
a metallic cell wall structure disposed within the interior cavity and in thermal communication with the thermally conductive enclosure, wherein the metallic cell wall structure comprises:
a plurality of cells, wherein each cell comprises cell walls defining a cell volume, a cell width less than about 5 millimeters, and a cell wall thickness in a range from about 0.25 millimeter to about 1 millimeter; and
a phase change material disposed within the cells and in thermal communication with the cell walls.

19. A system, comprising:
a thermally conductive enclosure bounding an interior cavity, wherein at least a portion of the thermally conductive enclosure comprises a hollow and hermetically sealed vapor chamber structure enclosing a liquid and a wick structure; and
a metallic cell wall structure integral to the thermally conductive enclosure and disposed within the interior cavity, wherein the metallic cell wall structure comprises:
a heat pipe, a vapor chamber, or a combination of a heat pipe and a vapor chamber;
a plurality of cells, wherein each cell comprises cell walls defining a cell volume, a cell width less than about 5 millimeters, and a cell wall thickness in a range from about 0.25 millimeter to about 1 millimeter; and
a phase change material disposed within the cells and in thermal communication with the cell walls.

* * * * *